(12) United States Patent
Ando et al.

(10) Patent No.: US 9,997,704 B2
(45) Date of Patent: *Jun. 12, 2018

(54) SCALED CROSS BAR ARRAY WITH UNDERCUT ELECTRODE

(71) Applicant: INTERNATIONAL BUSINESS MACHINES CORPORATION, Armonk, NY (US)

(72) Inventors: Takashi Ando, Tuckahoe, NY (US); Marwan H. Khater, Astoria, NY (US); Seyoung Kim, White Plains, NY (US); Hiroyuki Miyazoe, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/416,407

(22) Filed: Jan. 26, 2017

(65) Prior Publication Data

US 2018/0076387 A1    Mar. 15, 2018

Related U.S. Application Data

(63) Continuation of application No. 15/262,722, filed on Sep. 12, 2016, now Pat. No. 9,601,546.

(51) Int. Cl.
*H01L 31/00* (2006.01)
*H01L 45/00* (2006.01)
*H01L 27/24* (2006.01)

(52) U.S. Cl.
CPC ...... *H01L 45/1273* (2013.01); *H01L 27/2418* (2013.01); *H01L 45/1233* (2013.01); *H01L 45/146* (2013.01); *H01L 45/1616* (2013.01); *H01L 45/1625* (2013.01)

(58) Field of Classification Search
CPC .................................... H03H 9/00; H02B 1/00
See application file for complete search history.

(56) References Cited

U.S. PATENT DOCUMENTS

| 7,515,454 B2 * | 4/2009 | Symanczyk | ........ G11C 11/5614 257/154 |
| 9,362,496 B2 * | 6/2016 | Walls | ................... H01L 45/1253 |
| 9,601,546 B1 * | 3/2017 | Ando | ................... H01L 27/2463 |

OTHER PUBLICATIONS

Wong, H.-S. et al., "Metal-Oxide RRAM" Proceedings of the IEEE (Jun. 2012) pp. 1951-1970, vol. 100, Issue 6.
List of IBM Patents or Patent Applications Treated as Related dated Jan. 26, 2017, 2 pages.

* cited by examiner

*Primary Examiner* — Jaehwan Oh
*Assistant Examiner* — Andre' C Stevenson
(74) *Attorney, Agent, or Firm* — Tutunjian & Bitetto, P.C.; Louis J. Percello

(57) ABSTRACT

A cross bar array device includes first electrodes arranged adjacent to each other and extending in a first direction, the first electrodes including a main electrode layer and a scalable electrode layer. Second electrodes are arranged transversely to the first electrodes, the second electrodes including a main electrode layer and a scalable electrode layer. An electrolyte layer is disposed between the scalable electrode layers of the first electrodes and the second electrodes. A scalable electrode is formed from a scalable electrode layer and includes an undercut having a side laterally recessed from a width of a corresponding main electrode.

20 Claims, 8 Drawing Sheets

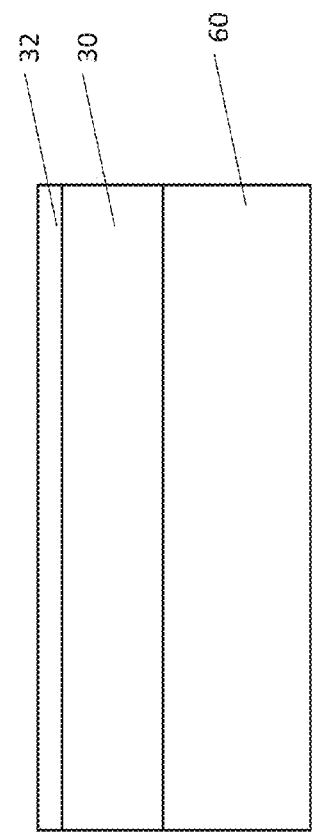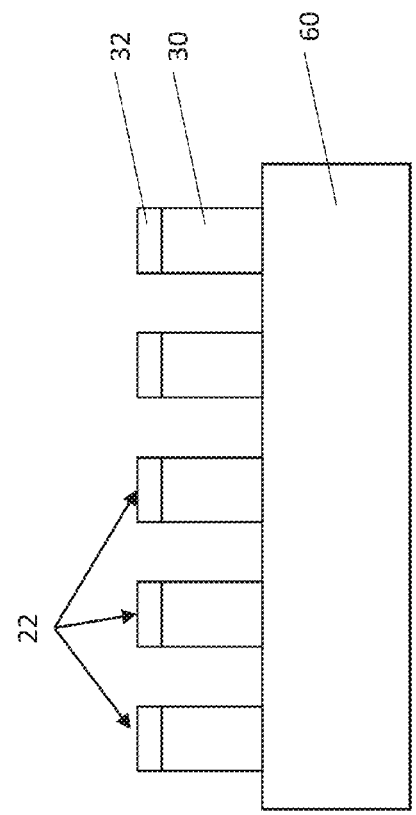
FIG. 6
FIG. 7

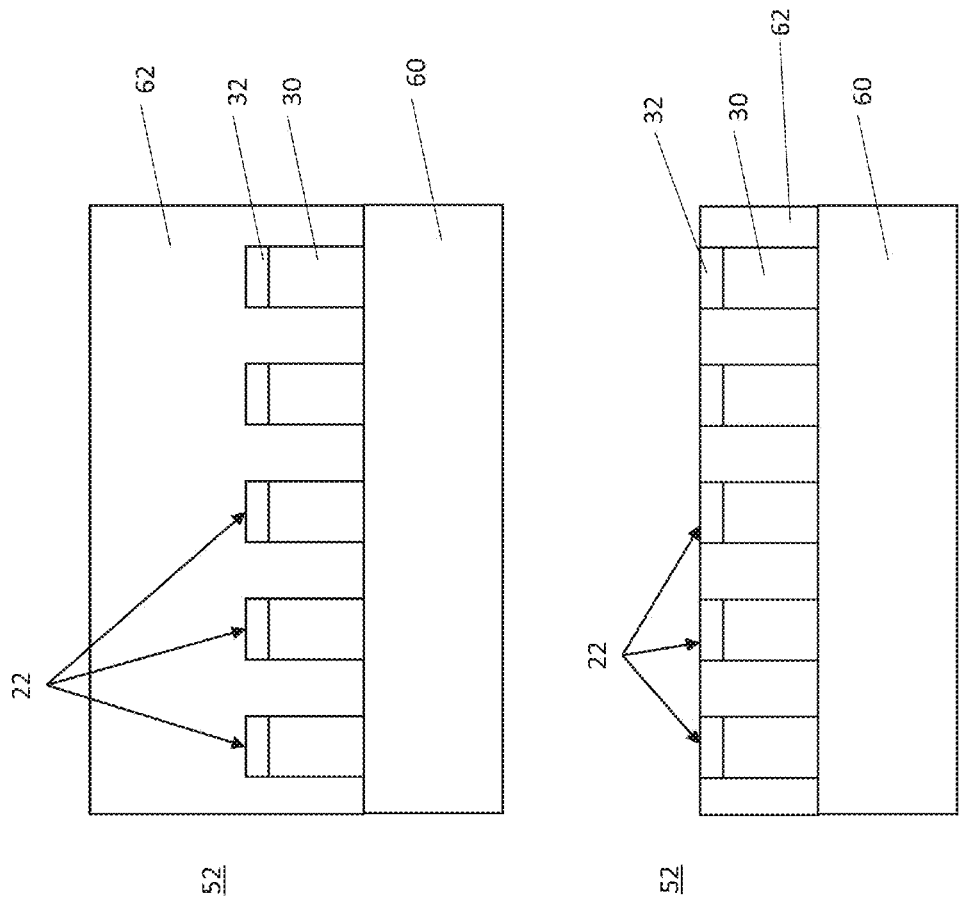

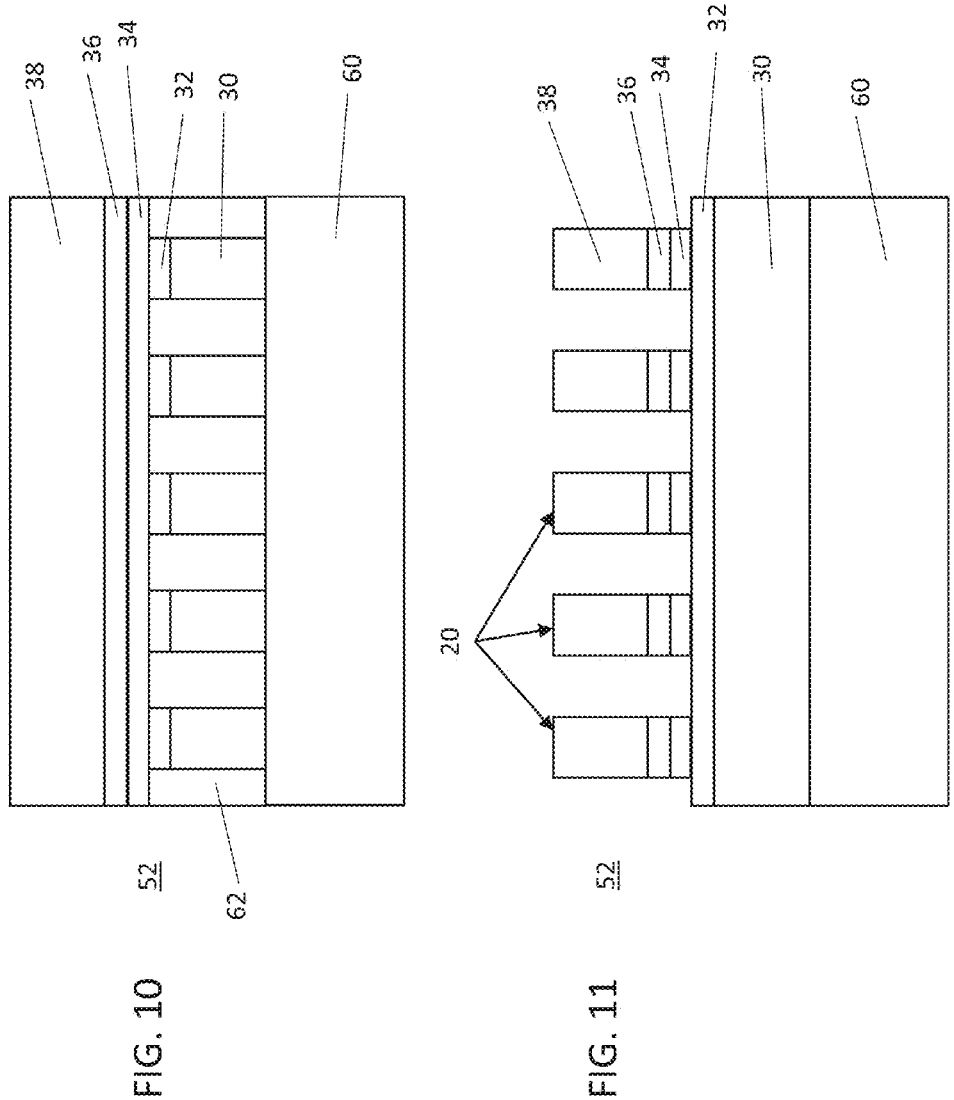

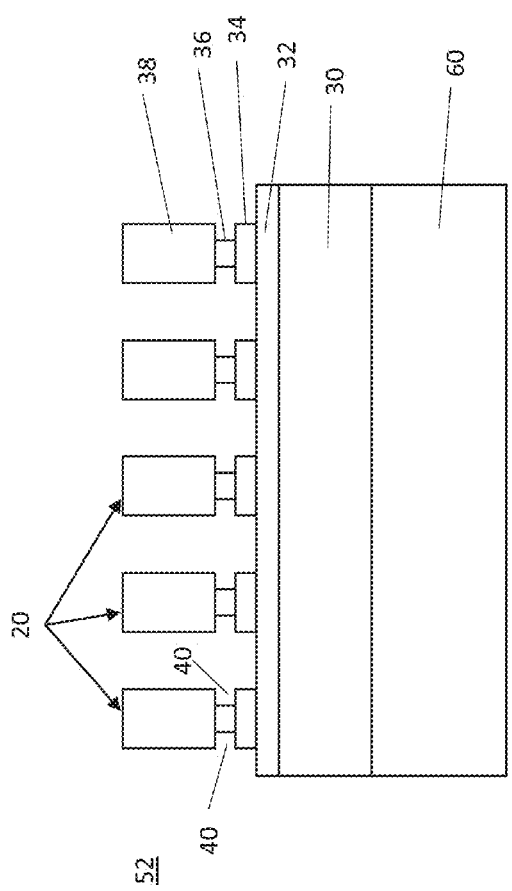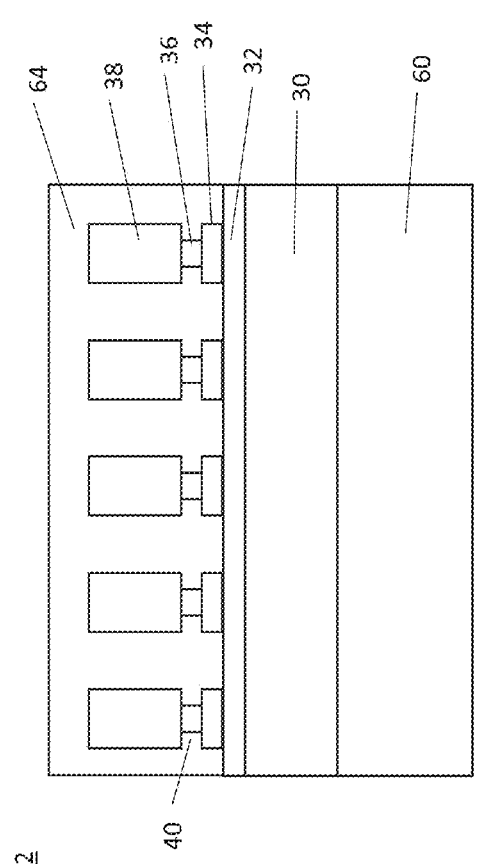

SCALED CROSS BAR ARRAY WITH UNDERCUT ELECTRODE

BACKGROUND

Technical Field

The present invention generally relates to cross bar array networks, and more particularly to cross bar array devices and methods for fabricating these devices using scalable electrodes to provide a reduced or scaled contact size while providing low contact resistance.

Description of the Related Art

Resistive random access memory (RRAM) is considered a promising technology for electronic synapse devices or memristors for neuromorphic computing as well as high-density and high-speed non-volatile memory applications. In neuromorphic computing applications, a resistive memory device can be employed as a connection (synapse) between a pre-neuron and post-neuron, representing the connection weight in the form of device resistance. Multiple pre-neurons and post-neurons can be connected through a cross-bar array of RRAMs, which can express a fully-connected neural network configuration.

SUMMARY

In accordance with an embodiment of the present invention, a cross bar array device includes first electrodes arranged adjacent to each other and extending in a first direction, the first electrodes including a main electrode layer and a scalable electrode layer. Second electrodes are arranged transversely to the first electrodes, the second electrodes including a main electrode layer and a scalable electrode layer. An electrolyte layer is disposed between the scalable electrode layers of the first electrodes and the second electrodes. A scalable electrode is formed from a scalable electrode layer and includes an undercut having a side laterally recessed from a width of a corresponding main electrode.

Another cross bar array device includes first electrodes arranged adjacent to each other and extending in a first direction, the first electrodes including a main electrode layer and a scalable electrode layer. Second electrodes are arranged transversely to the first electrodes, the second electrodes including a main electrode layer and a scalable electrode layer. An electrolyte is formed on the scalable electrode layer of the second electrodes and in contact with the scalable electrode layer of the first electrodes such that at intersection points between the first and second electrodes a resistive element is formed through the electrolyte. An undercut is formed in a scalable electrode formed in the scalable electrode layer of the second electrode to adjust a contact area while maintaining contact resistance with the main electrode layer of the second electrode.

A method for forming a cross bar array device includes patterning first electrodes arranged adjacent to each other and extending in a first direction, the first electrodes including a main electrode layer and a scalable electrode layer; planarizing a first dielectric layer over the first electrodes to expose the first electrodes; forming an electrolyte over the first electrodes; forming second electrodes over the electrolyte, the second electrodes including a main electrode layer and a scalable electrode layer; and etching the scalable electrode layer of at least one of the first and second electrodes to form an uncut.

These and other features and advantages will become apparent from the following detailed description of illustrative embodiments thereof, which is to be read in connection with the accompanying drawings.

BRIEF DESCRIPTION OF THE DRAWINGS

The disclosure will provide details in the following description of preferred embodiments with reference to the following figures wherein:

FIG. 6 is a cross-sectional view of a crossbar array device having a main electrode material and scalable electrode material formed on a substrate in accordance with aspects of the present invention;

FIG. 7 is a cross-sectional view of the crossbar array device of FIG. 6 having the main electrode material and the scalable electrode material patterned to form conductor lines in accordance with aspects of the present invention;

FIG. 8 is a cross-sectional view of the crossbar array device of FIG. 7 having a dielectric layer formed over the conductor lines in accordance with aspects of the present invention;

FIG. 9 is a cross-sectional view of the crossbar array device of FIG. 8 having a top surface planarized in accordance with aspects of the present invention;

FIG. 10 is a cross-sectional view of the crossbar array device of FIG. 9 showing an electrolyte, scalable electrode material and main electrode material formed in accordance with aspects of the present invention;

FIG. 11 is a cross-sectional view of the crossbar array device of FIG. 10 rotated 90 degrees and showing the electrolyte, scalable electrode material and main electrode material forming conductive lines in accordance with aspects of the present invention;

FIG. 12 is a cross-sectional view of the crossbar array device of FIG. 11 showing an undercut formed in the scalable electrode material of a top main electrode in accordance with aspects of the present invention; and FIG. 13 is a cross-sectional view of the crossbar array device of FIG. 12 showing a dielectric layer formed over the device in accordance with aspects of the present invention.

DETAILED DESCRIPTION

Figure 1:
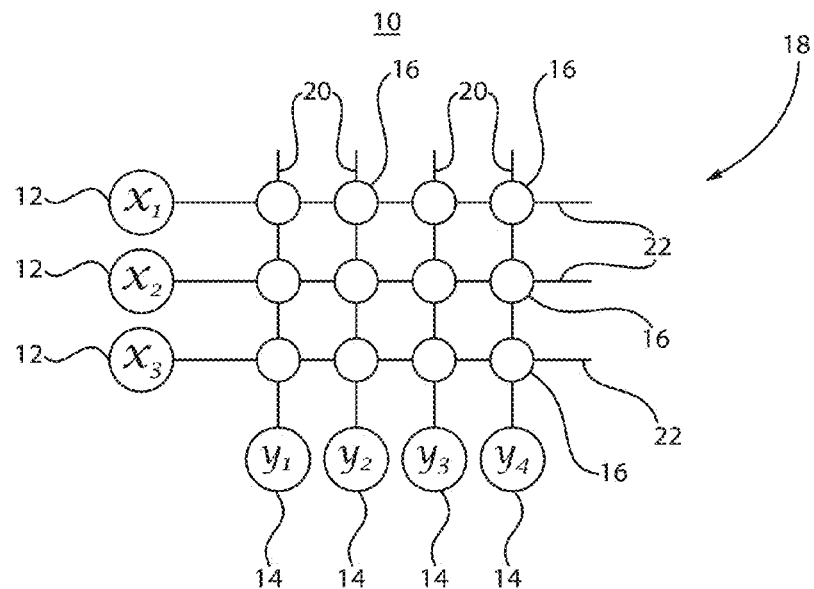
FIG. 1 is a schematic view of a neuromorphic device architecture with cells or nodes for conducting analog computer operations in accordance with aspects of the present invention.

In accordance with aspects of the present invention, resistive random access memory (RRAM) devices are provided. The RRAMs can be employed for electronic synapse devices or memristors for neuromorphic computing as well as high-density and high-speed non-volatile memory applications. In neuromorphic computing applications, a resistive memory device can be employed as a connection (synapse) between a pre-neuron and post-neuron, representing a connection weight in the form of device resistance. Multiple pre-neurons and post-neurons can be connected through a crossbar array of RRAMs, which can be configured as a fully-connected neural network.

Large scale integration of large RRAM arrays with complementary metal oxide semiconductor (CMOS) circuits can enable scaling of RRAM devices down to 10 nm and beyond for neuromorphic computing as well as high-density and high-speed non-volatile memory applications.

The crossbar array structure includes an undercut or scaled electrode with a partial undercut that enables the coexistence of high electrode conductivity and a small active area. This maintains the electrode cross section area as large as possible to maximize the conductivity and makes the contact area small to miniaturize the active device area.

It is to be understood that the present invention will be described in terms of a given illustrative architecture; however, other architectures, structures, substrate materials and process features and steps can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present invention. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a processing device 10 is shown in accordance with one implementation of the present invention. The device 10 employs very-large-scale integration (VLSI) systems including electronic analog circuits. In one embodiment, the device 10 includes a neuromorphic processor or neural network to mimic neuro-biological architectures present in the nervous system. The device 10 can describe analog, digital, and/or mixed-mode analog/digital VLSI and software systems that implement models of neural systems. The implementation of the device 10 can be realized using an array 18 of cells or nodes 16. The cells or nodes 16 can include, e.g., resistive random access memory (RRAM) devices or oxide-based memristors, etc.

The device 10 includes inputs 12 (e.g., $x_1, x_2, x_3, \ldots$). Inputs 12 can include a first electrical characteristic, such as a voltage. The neuromorphic device 10 includes a set of outputs 14 (e.g., currents: $y_1, y_2, y_3, y_4, \ldots$).

Figure 2:
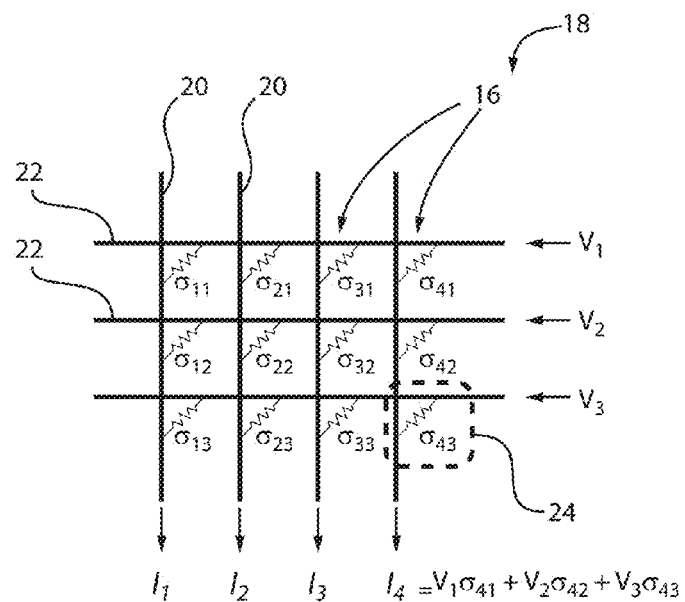
FIG. 2 is a schematic diagram of an array of resistive elements cross-connected to row and column conductors and showing a sample output for the neuromorphic device architecture in accordance with aspects of the present invention.

Referring to FIG. 2, the array 18 of FIG. 1 is shown in greater detail. The array 18 includes conductors 20 and conductors 22 running transversely to each other. The conductors 20 and 22 do not connect directly at intersection points as the conductors 20 and 22 are disposed on different levels. Instead, the conductors 20 and 22 are connected through resistive cross-point devices 24 located at each node 16.

Resistive cross-point devices 24 provide a highly parallel and scalable architecture composed of resistive devices for back-propagating neural networks. The Devices 24 can include resistive random access memory (ReRAM or RRAM) as will be described.

The cross-point devices 24 are configured to alter input signals and store data information. The cross-point devices 24 can be configured to implement algorithms or other functions. In other applications, fast and scalable architectures for matrix operations (e.g., inversion, multiplications, etc.) with cross-point devices 24 can be achieved. In one example, for forward matrix multiplication, voltages ($V_1, V_2, V_3$, etc.) are supplied on conductors 22 in rows, and currents ($I_1, I_2, I_3, I_4$, etc.) are read from conductors 20 in columns. Conductance values $\sigma$ are stored as weights. The conductance values in the array 18 include $\sigma_{11}, \sigma_{12}, \sigma_{13}, \sigma_{21}, \sigma_{22}, \sigma_{23}, \sigma_{31}, \sigma_{32}, \sigma_{33}, \sigma_{41}, \sigma_{42}, \sigma_{43}$, etc. In one example, $I4=V_1\sigma_{41}+V_2\sigma_{42}+V_3\sigma_{43}$.

For backward matrix multiplication, the voltages are supplied on the columns (20) and current is read from the rows (22). In one embodiment, weight updates can be achieved when voltages are applied on the rows and columns at the same time. The conductance values are updated all in parallel. It should be understood that the function and position of rows and columns are interchangeable, and the columns and rows can be switched. In some embodiments, pre or post neurons are connected to rows and columns to provide pre or post processing functions to operations performed by the array.

Figure 3:
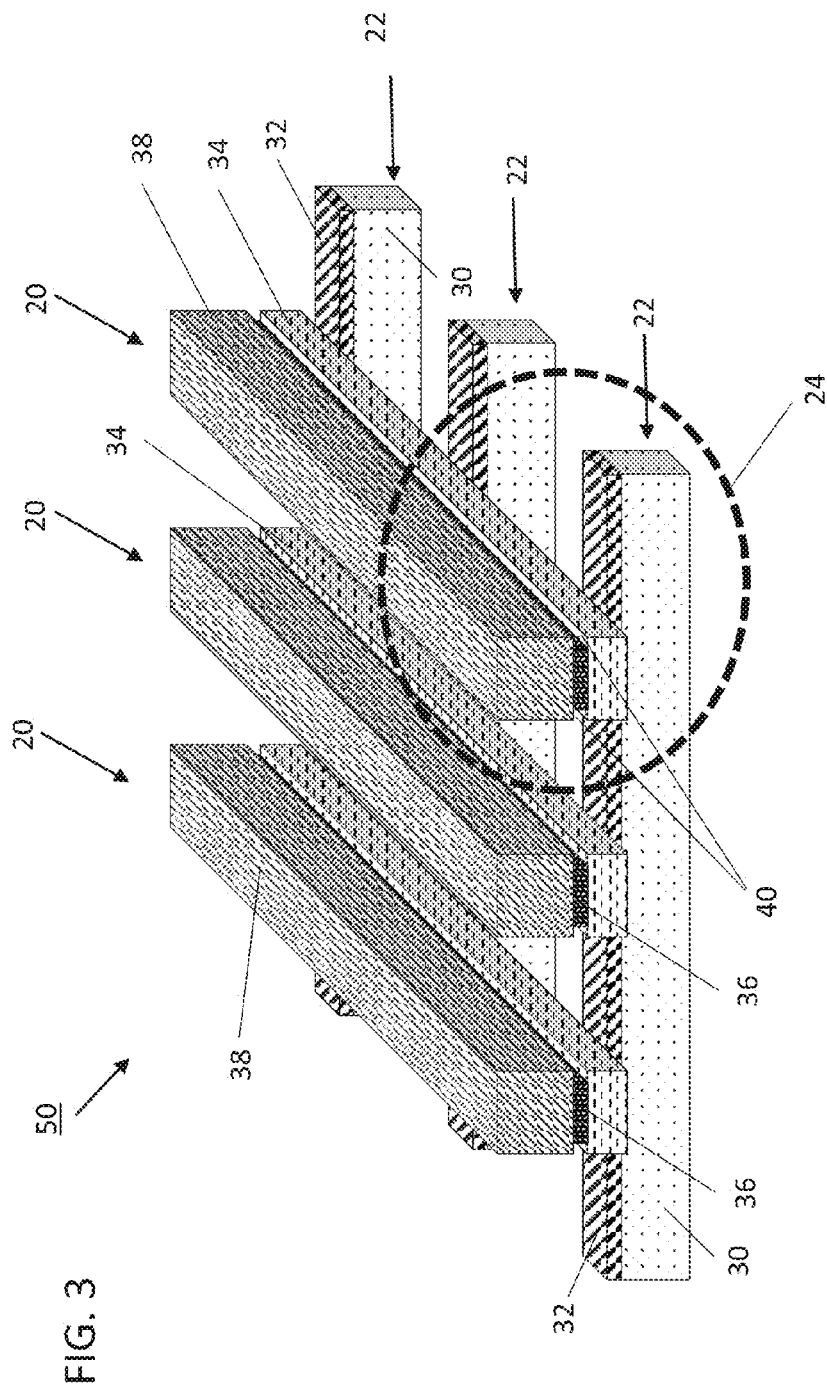
FIG. 3 is a perspective view of a crossbar array in accordance with aspects of the present invention.

Referring to FIG. 3, an illustrative cross-bar array 50 is shown in accordance with one embodiment. The crossbar array 50 includes rows 22 and columns 20 of conductive lines. The conductive lines 20 include a top electrode 38, a scalable electrode 36 and an electrolyte 34. The conductive lines 22 include a bottom electrode 30 and a scalable electrode 32 formed on the bottom electrode 30. An intersection of the rows 22 and columns 20 forms a resistive cross-point device 24.

In one embodiment, the electrolyte 34 is disposed between scalable electrodes 32 and 36. It should be understood that one or both of the scalable electrodes 32, 36 may be dimensionally scaled to provide a desired contact area. The bottom electrode 30 and the top electrode 38 may be formed from a same conductive material or different conductive materials. The bottom electrode 30 and the top electrode 38 can include low resistance metals, such as, e.g., Al, W, Cu or other suitable materials.

The scalable electrodes 32 and 36 include materials that can be selectively etchable relative to their respective bottom electrode 30 and top electrode 38. This selectivity is employed in the formation and scaling of the scalable electrodes 32 and 36 during fabrication. The scalable electrodes 32 and 36 make contact with the electrolyte 34. The scalable electrodes 32 and 36 are sandwiched between the electrolyte 34 and their respective main electrodes (i.e., bottom electrode 30 and top electrode 38). In this way, the scaling of the scalable electrodes 32 and 36 controls the contact area between the bottom electrode 30 and electrolyte 34 and top electrode 38 and the electrolyte 34 during operation. The scalable electrodes 32 and 36 can be scaled independently to provide a desired contact resistance in operation. While the contact area is controlled, the main electrodes 30 and 38 can maintain their size to provide sufficient conductivity during device operation.

In one embodiment, the electrolyte 34 includes a metal oxide, such as, e.g., $TiO_2$, $Al_2O_3$, $HfO_2$, $MnO_2$ or other metal oxides. The electrolyte 34 is thin, e.g., 2-5 nm in thickness, to selectively permit conduction therethrough when one or both of the main electrodes 30, 38 are activated. If the electrolyte 34 includes a metal oxide, the scalable electrodes 32, 36 are formed from an oxygen scavenging material, such as, Pt, TiN, etc. In this way, when an electric field is applied at the crossbar device 24, oxygen is drawn into the scavenging material creating a resistive conductive path through the electrolyte 34. This creates a first resistive state of the cross-point device 24. Another state may include a reset state where a reverse bias or other electric field is applied to at least one of the main electrodes 30, 38 to create a second resistive state of the cross-point device 24. In one embodiment, the reverse bias resets the cross-point device 24 to restore its original state.

The voltages applied to one or both of the main electrodes 30, 38 cause a break down in the oxide of the electrolyte 34 to adjust the resistance between the electrodes 30 and 38 by making the electrolyte 34 more conductive (or less conductive). The voltages may include millivolts to a few volts (e.g., 3 or 4 volts).

In some embodiments, during operation, a voltage on the top electrode 38 can cause a first response in the electrolyte material 34. A voltage on the bottom electrode 30 can cause a second response in the electrolyte material 34. Voltages on both the top electrode 38 and the bottom electrode 30 can provide a third response. The first, second and/or third responses can include programming a coefficient into the electrolyte 34 to alter its resistive properties, perform a computation by forming a resistive circuit, reading or writing a coefficient or a result through the resistive cross-point device 24, etc.

In useful embodiments, the top electrode 38 can include any suitable conductive material or materials. The top electrode 38 can include polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material can further comprise dopants that are incorporated during or after deposition.

The bottom electrode 30 can include any suitable conductive material or materials and can include a same or different material than the top electrode 38. In useful embodiments, the bottom electrode 30 can include polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material can further comprise dopants that are incorporated during or after deposition.

The electrolyte 34 can include a metal oxide although other dielectric electrolytes may be employed. In useful embodiments, the electrolyte layer 34 includes a material compatible with the scavenging properties of one or more of the scalable electrodes 32, 36. The electrolyte layer 34 can be deposited by evaporation, chemical vapor deposition (CVD), sputtering or other suitable deposition process.

The scalable electrodes 32, 36 can be formed by a selective etch performed to etch the sides of the electrode 32 or 36 to form an undercut 40 on each lateral side of, e.g., electrode 36. The selective etch can include a plasma etch or a wet etch. The etch process is timed to size the undercut 40 of electrode 36 to adjust a contact area between the top electrode 38 and the electrolyte 34. Using the dimensions of the undercut 40 of electrode 36, the properties of the electrolyte 34 and the voltages applied to the top electrode 38 and/or bottom electrode 30 provide the ability to program a coefficient or state of the resistive cross-point device 24 to function as an RRAM element. Note that the array 50 is encapsulated in an interlevel dielectric (not shown).

Figure 4:
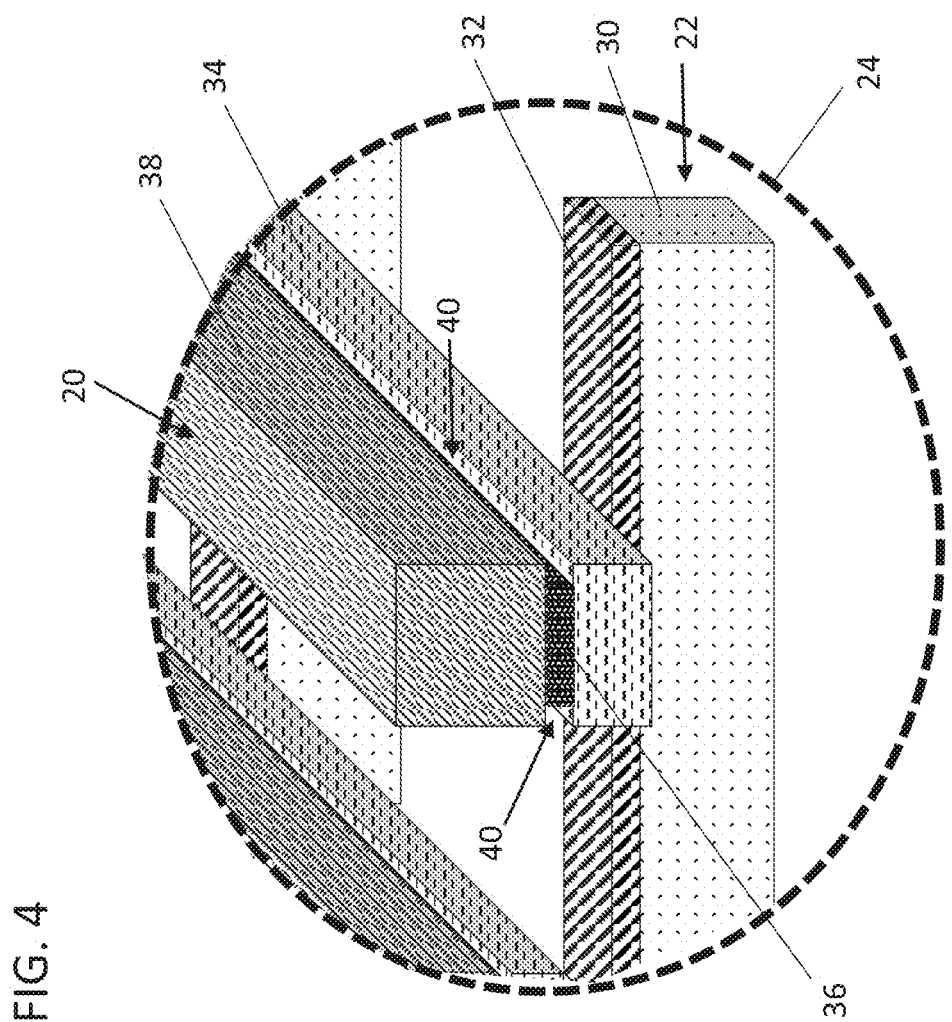
FIG. 4 is a magnified perspective view of the crossbar array of FIG. 3 in accordance with aspects of the present invention.

Referring to FIG. 4 with continued reference to FIG. 3, the resistive cross-point device 24 is shown in greater detail. The resistive cross-point device 24 can be employed for electronic synapse devices or memristors for neuromorphic computing as well as high-density and high-speed non-volatile memory applications. The resistive cross-point device 24 can be employed as a connection (synapse) between a pre-neuron and post-neuron (not shown), representing a connection weight in the form of device resistance. Multiple pre-neurons and post-neurons can be connected through the crossbar array 50 of RRAMs, which form a neural network or the like.

The crossbar array 50 includes the scalable electrode 36 with the partial undercut or undercuts 40 that enable high electrode conductivity and a small active area. This maintains the electrode cross section area (e.g., to top electrode 38) as large as possible to maximize the conductivity and makes the contact area small (e.g., through the undercut 40 in electrode 36) to miniaturize the active device area.

Large scale integration of large RRAM arrays, in accordance with aspects of the present invention, can be employed with CMOS circuits that enable scaling of RRAM devices down to 10 nm and beyond for neuromorphic computing as well as high-density and high-speed non-volatile memory applications. In one embodiment, a resistance of a high resistance state (HRS) increases as the inverse of the cell area, and a resistance of low resistance state (LRS) has only a slight dependency on the cell area. The present embodiments take advantage of the increasing HRS/LRS resistance ratio as cell area decreases as a benefit of device scaling by providing the cross bar array structure with miniaturized devices and a highly conductive electrode.

Figure 5:
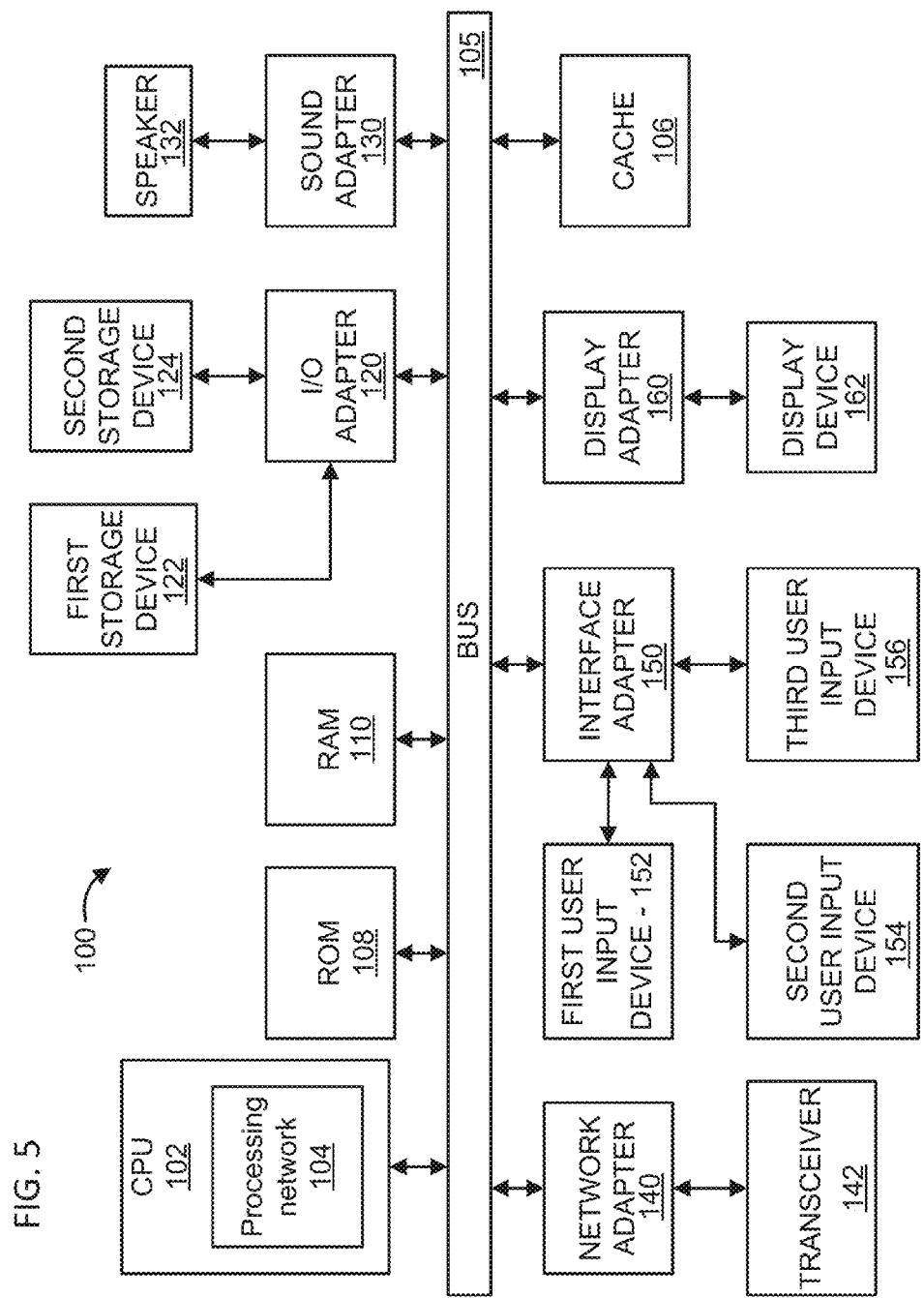
FIG. 5 is a block/flow diagram showing a system/method for implementing a crossbar array in accordance with aspects of the present invention.

Referring to FIG. 5, an exemplary neuromorphic processing system 100 to which aspects of the present invention can be applied is shown in accordance with one embodiment. The processing system 100 includes at least one computer processing unit (CPU), which includes a neural or processing network 104 operatively coupled to other components via a system bus 105.

The processing network 104 can include one or more neuromorphic computing devices including a resistive memory device that can be employed as a connection (synapse) between one or more pre-neurons and post-neurons, representing a connection weight in the form of device resistance. Multiple pre-neurons and post-neurons can be connected through a crossbar array of RRAMs to form a fully-connected neural network (104).

A cache 106, a Read Only Memory (ROM) 108, a Random Access Memory (RAM) 110, an input/output (I/O) adapter 120, a sound adapter 130, a network adapter 140, a user interface adapter 150, and a display adapter 160, can be operatively coupled to the system bus 102.

A first storage device 122 and a second storage device 124 are operatively coupled to system bus 105 by the I/O adapter 120. The storage devices 122 and 124 can be any of a disk storage device (e.g., a magnetic or optical disk storage device), a solid state magnetic device, and so forth. The storage devices 122 and 124 can be the same type of storage device or different types of storage devices.

A speaker 132 is operatively coupled to system bus 102 by the sound adapter 130. A transceiver 142 is operatively coupled to system bus 102 by network adapter 140. A display device 162 is operatively coupled to system bus 102 by display adapter 160.

A first user input device 152, a second user input device 154, and a third user input device 156 are operatively coupled to system bus 102 by user interface adapter 150. The user input devices 152, 154, and 156 can be any of a keyboard, a mouse, a keypad, an image capture device, a motion sensing device, a microphone, a device incorporating the functionality of at least two of the preceding devices, and so forth. Of course, other types of input devices can also be used. The user input devices 152, 154, and 156 can be the same type of user input device or different types of user input devices. The user input devices 152, 154, and 156 are used to input and output information to and from system 100.

Of course, the processing system 100 can also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 100 are readily contemplated by one of ordinary skill in the art given the teachings of the present invention provided herein.

The present invention can be a system, a method, and/or a computer program product. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Referring to FIG. 6, a cross-sectional view of a partially fabricated semiconductor device 52 illustratively shows the formation of a cross bar array in accordance with aspects of the present invention. The device 52 includes a substrate 60, which may be a semiconductor or an insulator with an active surface semiconductor layer. The substrate may be crystalline, semi-crystalline, microcrystalline or amorphous. The substrate may be essentially (e.g., except for contaminants) a single element (e.g., silicon), primarily (e.g., with doping) of a single element, for example, silicon (Si) or germanium (Ge), or the substrate 60 may include a compound, for example, $Al_2O_3$, $SiO_2$, GaAs, SiC, or SiGe. The substrate 60 may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 60 may also have other layers forming the substrate 60, including high-k oxides, nitrides, etc. In one or more embodiments, the substrate 60 may be a silicon wafer or a semiconductor formed on silicon (e.g., InP on GaAs on Si). In various embodiments, the substrate 60 may be a single crystal silicon (Si), silicon germanium (SiGe), or III-V semiconductor (e.g., GaAs, InP) wafer, or have a single crystal silicon (Si), silicon germanium (SiGe), or III-V semiconductor (e.g., GaAs) surface/active layer. In the present embodiment, the substrate 60 will illustratively be described as InP, which may be formed on GaAs over Si.

Material for the bottom electrode 30 may be deposited on the substrate 60 or layers of the substrate 60. The scalable electrode 32 is deposited on the material for the bottom electrode 30. The bottom electrode 30 and the scalable electrode 32 can be deposited using any suitable deposition process, e.g., chemical vapor deposition, atomic layer deposition, sputtering, evaporation, etc.

Referring to FIG. 7, a patterning process is performed to form lines 22 by forming a mask and etching the scalable electrode 32 and the bottom electrode 30. In one embodiment, different etching chemistries are employed to etch the scalable electrode 32 and the bottom electrode 30 since these materials are selectively etchable relative to each other. The patterning process may include a lithography process or any other suitable patterning technique. The etching processes can include reactive ion etching (RIE).

Referring to FIG. 8, a dielectric layer 62 is formed over the lines 22 to fill in between the lines 22. The dielectric layer 62 will support the formation of transverse conductor lines for the cross bar array. The dielectric layer 62 can include an oxide, such as silicon oxide, although other dielectric materials may be employed.

Referring to FIG. 9, the dielectric layer 62 is planarized (e.g., by chemical mechanical polishing (CMP)). The planarization exposes the scalable electrode 32.

Referring to FIG. 10, the electrolyte 34 is formed over the scalable electrodes and the planarized surface. The electrolyte 34 may be deposited by chemical vapor deposition or other process to form, e.g., a metal oxide or the like. Next, the scalable electrode 36 is deposited on the electrolyte 34. Then, the top electrode 38 is formed by deposition on the scalable electrode 36.

Referring to FIG. 11, a 90 degree rotated view from the view in FIG. 10 is shown to depict trenches formed through the top electrode 38, the scalable electrode 36 and the electrolyte 34. The top electrode 38 and the scalable electrode 36 can be deposited using any suitable deposition process, e.g., chemical vapor deposition, atomic layer deposition, sputtering, evaporation, etc. A patterning process is performed to form lines 20 by forming a mask and etching the top electrode 38 and the scalable electrode 36. In one embodiment, different etching chemistries are employed to etch the scalable electrode 36 and the top electrode 38 since these materials are selectively etchable relative to each other. The patterning process may include a lithography process or any other suitable patterning technique. The etching processes includes reactive ion etching (RIE). While FIG. 11 depicts the electrolyte 34 etched, the electrolyte 34 can be left intact until the spacer 36 is laterally etched as will be described.

Referring to FIG. 12, a selective etch process is performed, preferably before patterning the electrolyte 34, to tailor the scalable electrode 36 to a desired area. The selective etch selectively removes material of the scalable electrode 36 relative to the top electrode 38 and electrolyte 34 if the selective etch to form undercuts 40 is performed before removing electrolyte 34. If the electrolyte 34 is patterned (etched) before the selective etch, the selective etch selectively removes material of the scalable electrode 36 relative to the top electrode 38, bottom electrode 30, scalable electrode 32 and the electrolyte 34. Note that the one or both of the scalable electrodes 32, 36 can be laterally etched to form undercuts. The etch may include RIE or a wet etch.

The selective etch forms undercuts 40 in the electrode material. The undercuts 40 may be formed on one side or both sides of the electrode material 36. The etch process is timed to set a contact area (e.g., resistive property) of the electrode 36 (and/or electrode 32). In some embodiments, the undercut 40 may include up to about 25% (or more) of a total width of the top electrode 38 on each side.

Referring to FIG. 13, dielectric material 64 is formed to encapsulate and insulate the lines 20 and to form an inter-level dielectric (ILD). Processing can continue with planarization, the formation of additional components, metallizations, etc.

Having described preferred embodiments for scaled cross bar array with undercut electrode (which are intended to be illustrative and not limiting), it is noted that modifications and variations can be made by persons skilled in the art in light of the above teachings. It is therefore to be understood that changes can be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A cross bar array device, comprising:
    an electrolyte layer disposed between first electrodes and second electrodes, the second electrodes being transversely disposed to the first electrodes; and
    at least one scalable electrode formed including an undercut having a side laterally recessed from a width of a corresponding main electrode of at least one of the first electrodes and second electrodes.

2. The device as recited in claim 1, wherein the electrolyte layer forms a resistive element programmable to provide at least two resistive states.

3. The device as recited in claim 1, wherein the electrolyte layer includes a metal oxide and the at least one scalable electrode includes an oxygen scavenging material.

4. The device as recited in claim 1, wherein the undercut includes lateral recesses from the width of the corresponding main electrode on two sides of the at least one scalable electrode.

5. The device as recited in claim 1, wherein the undercut includes a width set in accordance with a desired resistive property.

6. The device as recited in claim 1, further comprising a cross-point device formed at intersections of the first and second electrodes.

7. The device as recited in claim 6, wherein the cross-point device includes at least two resistive states based on electric fields generated by the first and second electrodes.

8. The device as recited in claim 1, wherein the device forms a neural network.

9. A cross bar array device, comprising:
 an electrolyte formed on a scalable electrode layer of first electrodes and in contact with a scalable electrode layer of second electrodes, arranged transversely to the first electrodes, such that at intersection points between the first and second electrodes a resistive element is formed through the electrolyte; and
 an undercut formed in a scalable electrode of the scalable electrode layer of at least one of the first and second electrodes to adjust a contact area while maintaining contact resistance with a main electrode layer of one of the first electrodes and second electrodes.

10. The device as recited in claim 9, wherein the resistive element is programmable to provide at least two resistive states.

11. The device as recited in claim 9, wherein the electrolyte layer includes a metal oxide and the scalable electrode includes an oxygen scavenging material.

12. The device as recited in claim 9, wherein the undercut includes lateral recesses from a width of the corresponding main electrode on two sides of the scalable electrode.

13. The device as recited in claim 9, wherein the undercut includes a width set in accordance with a desired resistive property.

14. The device as recited in claim 9, wherein the first electrodes include a scalable electrode layer having an undercut.

15. The device as recited in claim 9, further comprising a cross-point device formed at intersections of the first and second electrodes, wherein the cross-point device includes at least two resistive states based on electric fields generated by the first and second electrodes.

16. The device as recited in claim 9, wherein the device forms a neural network.

17. A method for forming a cross bar array device, comprising:
 forming an electrolyte over first electrodes, which include a main electrode layer and a scalable electrode layer;
 forming second electrodes over the electrolyte, the second electrodes including a main electrode layer and a scalable electrode layer; and
 etching the scalable electrode layer of at least one of the first and second electrodes to form an uncut.

18. The method as recited in claim 17, wherein intersections of the first electrodes and the second electrodes form a resistive element from the electrolyte with a contact area controlled by the undercut.

19. The method as recited in claim 18, wherein the resistive element includes at least two resistive states set using voltages on the first and/or second electrodes.

20. The method as recited in claim 18, further comprising programming the resistive element to provide one of at least two resistive states.

* * * * *